(12) United States Patent
Cairns et al.

(10) Patent No.: US 6,262,598 B1
(45) Date of Patent: Jul. 17, 2001

(54) VOLTAGE LEVEL SHIFTER

(75) Inventors: Graham Andrew Cairns, Cutteslowe; Michael James Brownlow, Sandford on Thames, both of (GB); Yasushi Kubota; Hajime Washio, both of Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/517,984

(22) Filed: Mar. 3, 2000

(30) Foreign Application Priority Data

Mar. 5, 1999 (GB) .................................................. 9905041

(51) Int. Cl.$^7$ ............................................. H03K 19/0175
(52) U.S. Cl. .................................. 326/81; 326/80; 326/83; 326/114
(58) Field of Search .................................. 326/80, 81, 83, 326/56, 57, 114, 119, 121, 122, 115

(56) References Cited

U.S. PATENT DOCUMENTS

| | | | |
|---|---|---|---|
| 4,521,703 | 6/1985 | Dingwall | 307/530 |
| 4,707,623 | * 11/1987 | Bismarck | 326/68 |
| 4,845,381 | * 7/1989 | Cuevas | 327/333 |
| 4,914,323 | * 4/1990 | Shibata | 327/589 |
| 5,187,388 | * 2/1993 | Moy | 326/49 |
| 5,272,389 | 12/1993 | Hatada | 307/264 |
| 5,506,535 | * 4/1996 | Ratner | 327/333 |
| 5,670,898 | * 9/1997 | Fang | 326/93 |

FOREIGN PATENT DOCUMENTS

| | | | |
|---|---|---|---|
| 0465873-A1 | * 1/1992 | (EP) | 326/57 |
| 0600734 | 6/1994 | (EP) . | |
| 2321145 | 7/1998 | (GB) . | |
| 404242371 | * 8/1992 | (JP) | 326/81 |
| 9808304 | 2/1998 | (WO) . | |

OTHER PUBLICATIONS

Search Report, Application No. GB 9905041.1, dated May 28, 1999.

* cited by examiner

*Primary Examiner*—Michael Tokar
*Assistant Examiner*—Steven S. Paik
(74) *Attorney, Agent, or Firm*—Renner, Otto, Boisselle & Sklar

(57) ABSTRACT

A voltage level shifter comprises complementary transistors T1, T2 connected between a supply line vdd and an inverting input !IN. The gate of the transistor T1 is connected to a direct signal input IN whereas the gate of the transistor T2 receives a shifted version of the direct input signal from a source-follower comprising the transistors T3 and T4. The level shifter may also be embodied as a differential cross-coupled sense amplifier with the sources of the drain load transistors being crossed coupled to the differential inputs.

13 Claims, 14 Drawing Sheets

VOLTAGE LEVEL SHIFTER

The present invention relates to a voltage level shifter. Such a shifter may, for example, be used in large area silicon-on-insulator (SOI) circuits for interfacing with signals of smaller amplitudes. An example of such an application is monolithic driver circuitry for flat-panel matrix displays, such as liquid crystal displays, fabricated with low temperature poly-silicon thin-film transistors (TFTs) where interfacing between signal levels of 3.3 to 5 volts and signals of 10 to 20 vlts is often required. Another application is in random access memories (RAM) for improving the response time of line sense amplifiers.

FIG. 1 of the accompanying drawings illustrates a basic CMOS inverter which may be used as a simple voltage level shifter. The inverter comprises a P-type transistor T1 and an N-type transistor T2 whose drains are connected together and whose sources are connected to a supply line vdd and ground gnd, respectively. The gates of the transistors T1 and T2 are connected together and to an input terminal IN and the drains of the transistors T1 and T2 are connected together to an inverting output !OUT. The input signals can swing about the inverter switch point between logic levels which are less than the voltages defined by the supply line vdd and ground gnd. The inverter can operate as a level shifter because the output swings between voltage levels which are almost equal to the voltages of the supply line vdd and ground gnd. However, in practice, the degree of level shifting is relatively small because voltages close to the inverter switch point result in simultaneous and undesirable conduction of the transistors T1 and T2 the condition for this not to occur is that:

$$|\Delta V_{IN}| > VDD - V_{Tn} - |V_{Tp}|$$

where VDD is the voltage on the supply line vdd and $V_{Tn}$ and $V_{Tp}$ are the threshold voltages of the N-type and P-type transistors, respectively.

FIG. 2 of the accompanying drawings illustrates another type of single input level shifter for low input voltages, for example as disclosed in U.S. Pat. No. 4,707,623. The shifter comprises a first circuit branch comprising a first P-type transistor T1 and a second N-type transistor T2 with their drains connected together to an inverting output !OUT and their sources connected to a supply line vdd and ground gnd, respectively. The level shifter comprises a second circuit branch comprising third and fourth P-type transistors T3 and T4. The source of the third transistor T3 is connected to the supply line vdd whereas the drain of the fourth transistor T4 is connected to ground gnd. The drain of the transistor T3 is connected to the source of the transistor T4 and to the gate of the transistor T2. An input IN is connected to the gates of the transistors T1 and T4. A bias voltage input Vb is connected to the gate of the transistor T3. The transistors T3 and T4 are connected as a source follower whose output voltage is given by $V_{IN}+(VDD-Vb)$ when the transistors T3 and T4 are matched and are in saturation. The input signal drives the gate of the transistor T1 directly whereas the output of the source follower drives the gate of the transistor T2 with a copy of the input signal which is shifted in the positive direction by (Vdd−Vb). These voltage levels are sufficient to switch the transistors T1 and T2, which operate as push-pull devices with high state logic input levels which are substantially lower than the supply voltage and low state logic input levels which are substantially equal to ground potential.

FIG. 3 illustrates the results of a simulation of the level shifter shown in FIG. 2 used to shift a 0-5 volt input to a 15-0 volt output with the bias voltage input Vb connected to ground. For this simulation, all transistors are of equal size except the transistor T2 which is of twice the width of the other transistors for correct operation. The output !OUT is loaded, in the simulation, with the input of an inverter of the type shown in FIG. 1. The simulated transistor performance is similar to that which is achievable with low temperature poly-silicon TFT technology.

FIG. 3 illustrates the voltage levels of the input signal IN, the output signal !OUT and the supply voltage VDD. Also, the switching level of the inverter to which the output is simulated as being connected is illustrated. The output !OUT swings about the switch point of the inverter, in particular between values of 2.3 volts and 10.4 volts. However, because of the small voltage transitions at the output, the scaling of the transistors T1 and T2 has to be relatively precise in order to ensure a sufficient voltage swing about the inverter switch level. Also, this signal does not fully turn off at least one of the inverter transistors and this results in relatively high current consumption in the inverter.

FIG. 4 of the accompanying drawings illustrates a known type of CMOS sense amplifier of the type disclosed in A. Bellaouar and M. Elmasry, "Low-power Digital VLSI Design Circuits and Systems", Kluwer Academic Publishers, 1995. The sense amplifier comprises second and sixth P-type transistors T2 and T6 and first, fifth and seventh N-type transistors T1, T5 and T7. The transistors T7 acts as a tail current source with its source connected to ground gnd and its gate connected to a bias voltage input Vb. The transistors T1 and T5 are connected as a long tail pair with their sources connected to the drain of the transistor T7 and their gates connected to a first input IN for receiving direct input signals and a second input !IN for receiving inverted input signals. The drains of the transistors T1 and T5 are connected to outputs !OUT and OUT and to the drains of the transistors T2 and T6, respectively. The sources of the transistors T2 and T6 are connected to the supply line vdd. The gate of the transistor T2 is connected to the drain of the transistor T6 whereas the gate of the transistor T6 is connected to the drain of the transistor T2.

The sense amplifier thus has two differential inputs and two differential outputs. For the purpose of explaining operation of the amplifier, the transistors are assumed to be perfectly matched with identical input voltage levels supplied to the inputs so that the tail current flows in equal portions through the first circuit branch comprising the transistors T1 and T2 and the second circuit branch comprising the transistors T5 and T6. This condition is meta-stable and changes in response to any perturbation of the differential input voltage. For example, if the voltage at the input IN is slightly larger than that at the inverting input !IN, the transistor T1 turns on more than the transistor T5. This has the effect of lowering the voltage at the inverting output !OUT. The transistor T6 is turned on more and this increases the voltage at the direct output OUT. The transistor T2 is thus turned off further, which reduces the voltage at the ouput !OUT and increases the voltage at the output OUT. Thus, a slight imbalance in the voltages supplied to the inputs IN and !IN is sensed and amplified. However, the output voltages cannot swing between ground potential and the supply line potential because some tail current is always flowing.

FIG. 5 of the accompanying drawings illustrates an "inverted logic" version of the amplifier illustrated in FIG. 4. In particular, the conduction types of the transistors are reversed and the supply voltage polarity is reversed. Such an arrangement is more useful for level-shifting the high logic state of the input with the low logic state of the input and output being at ground.

FIG. 6 of the accompanying drawings illustrates a simulation of the amplifier shown in FIG. 5 with the same conditions as were used for the simulation of the shifter of FIG. 2 illustrated in FIG. 3. Initially, the direct input signal IN is low (so that the inverted input signal !IN is high) and the inverted output signal !OUT is high (so that the direct output signal OUT is low). When the input signals change state, the transistor T5 becomes more turned on than the transistor T1. The transistor T5 starts to pull the output OUT high but in conflict with the transistor T6. This conflict continues until the gate of the transistor T2 reaches its threshold and begins to discharge the output !OUT and to turn off the transistor T6. The outputs thus change state with a voltage swing of between 3.0 volts and 13.6 volts.

FIG. 7 of the accompanying drawings illustrates a single-ended current-mirror sense amplifier which differs from that shown in FIG. 4 in that the transistors T2 and T6 are connected as a current mirror. Such an amplifier is disclosed in N. Weste and K. Eshraghian, "Principles of CMOS VLSI Design", Addison Wesley, 1993 and is commonly used in static RAM circuits. The operation of the amplifier shown in FIG. 7 is similar to that shown in FIG. 4.

FIG. 8 of the accompanying drawings illustrates another known type of level shifter which is used to boost the logic high input state with respect to ground. The amplifier comprise P-type transistors T2a, T2b, T6a and T6b and N-type transistors T1 and T5 with the N-type transistors being significantly wider than the other transistors. The transistors T2b, T2a and T1 are connected in series between the supply line vdd and ground gnd whereas the transistors T6b, T6a and T5 are connected in series between the supply line vdd and ground gnd. The drains of the transistors T1 and T5 are connected to outputs !OUT and OUT, respectively. The gates of the transistors T2a and T1 are connected to an input IN. The gates of the transistors T6a and T5 are connected to an inverting input !IN. The gates of the transistors T2b and T6b are connected to the outputs OUT and !OUT, respectively.

For the purpose of describing the operation of the amplifier of FIG. 8, it is assumed that the input IN is low, the input !IN is high, the output OUT is low and the output !OUT is high. When the inputs are switched such that the input IN becomes high and the inverting input !IN becomes low, the transistor T1 is turned on and pulls down the output !OUT in conflict with the transistors T2a and T2b. The conflict arises because the transistor T2b remains turned on whereas the transistor T2a has not been fully switched off by the high input logic level at the input IN. When the transistor T1 pulls the output !OUT low, the transistor T6b is switched on and the transistors T6b and T6a conduct so as to switch off the transistor T2b. The output states therefore switch. However, a limitation of this level shifter is that the input logic level must be higher than the threshold voltage of the N-type transistors T1 and T5.

According to the invention, there is provided a voltage level shifter comprising a first circuit branch, a first input for receiving a direct input signal, a second input for receiving an inverted input signal, and an output for producing an inverted output signal which is inverted and level-shifted relative to the direct input signal, the first circuit branch comprising: a first transistor, of a first conduction type, whose output electrode is connected to the output and whose control electrode is connected to the first input; and a second transistor, of a second conduction type opposite the first type, whose output electrode is connected to the output, whose control electrode is arranged to receive a signal corresponding to the direct input signal, and whose common electrode is connected to the second input, wherein the control electrode of the second transistor may be connected to a second circuit branch, and the second circuit branch may comprise third and fourth transistors, of the first conduction type, whose main conduction paths are connected in series between first and second power supply inputs, the control electrode of the fourth transistor being connected to the first input and the control electrode of the second transistor being connected to the output electrode of the third transistor and to the common electrode of the fourth transistor.

The common electrode of the first transistor may be connected to the first power supply input.

The control electrode of the third transistor may be connected to a first bias voltage input. As an alternative, the control electrode of the third transistor may be connected to the second input.

The first input may be connected to the control electrodes of the first and fourth transistors via the main conduction path of an eighth transistor whose control electrode is connected to a first gating input for receiving a direct gating signal. The control electrode of the third transistor may be connected to a second gating input for receiving an inverted gating signal. The control electrode of the second transistor may be connected to the second power supply input via the main conduction path of a ninth transistor whose control electrode is connected to the second gating input. The control electrode of the first transistor may be connected to the second power supply input via the main conduction path of a tenth transistor whose control electrode is connected to the second gating input.

The output may be connected to the input of an inverter.

Each of the transistors may comprise a filed effect transistor and the output, control and common electrodes may comprise drain, gate and source electrodes, respectively. Each of the transistors may comprise an amorphous silicon thin film transistor. As an alternative, each of the transistors may comprise a poly-silicon thin film transistor. The shifter may comprise at least part of a CMOS integrated circuit.

It is thus possible to improve the performance of a level shifter. In particular, one or more of the following advantages may be achieved:

(a) greater sensitivity permitting operation with very low input voltages;

(b) faster response times;

(c) more robustness to process variation;

(d) lower power consumption resulting from improved logic level voltages;

(e) a higher degree of voltage level shifting without error.

The invention will be further described, by way of example, with reference to the accompanying drawings, in which.

Like reference numerals refer to like parts throughout the drawings.

Figure 9:
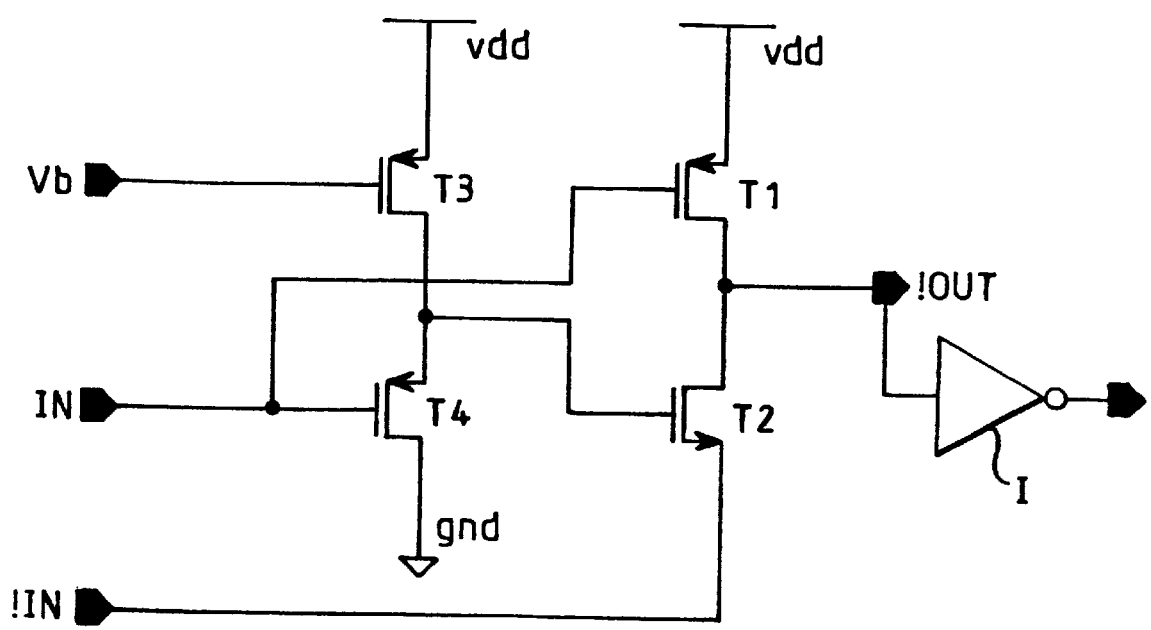
FIG. 9 is a circuit diagram of a level shifter constituting a first embodiment of the invention.

The level shifter illustrated in FIG. 9 is similar to that shown in FIG. 2 and will be described in detail only in so far as it differs therefrom. In particular, the source of the second transistor T2 is connected to a second inverting input !IN which receives an inverted input signal i.e. a signal which is the logical complement of the direct input signals supplied to the input IN.

Figure 1:
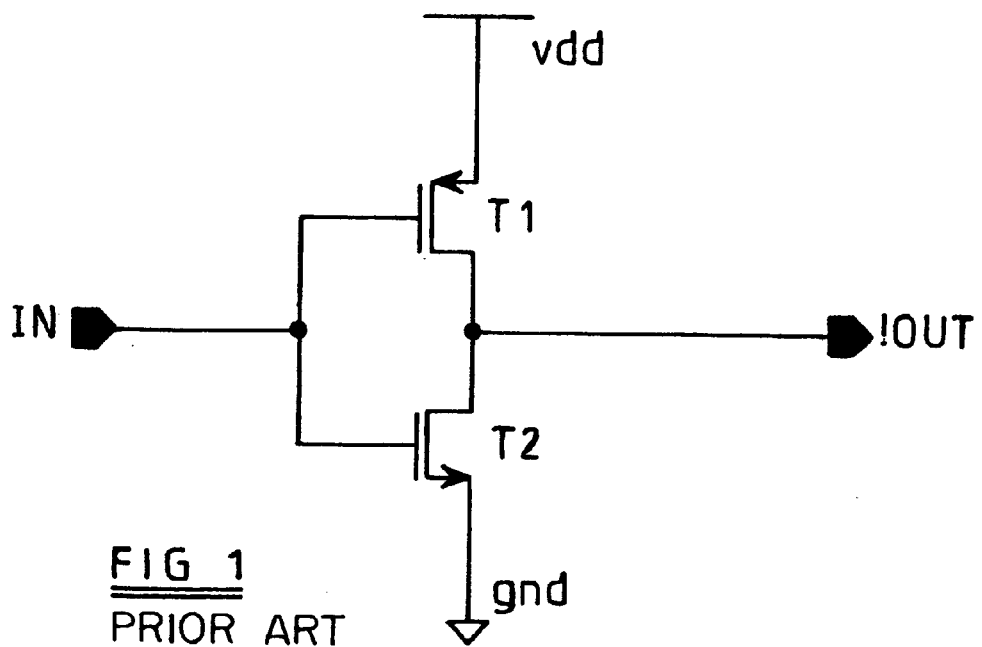
FIG. 1 is a circuit diagram of a known type of CMOS inverter.
Figure 2:
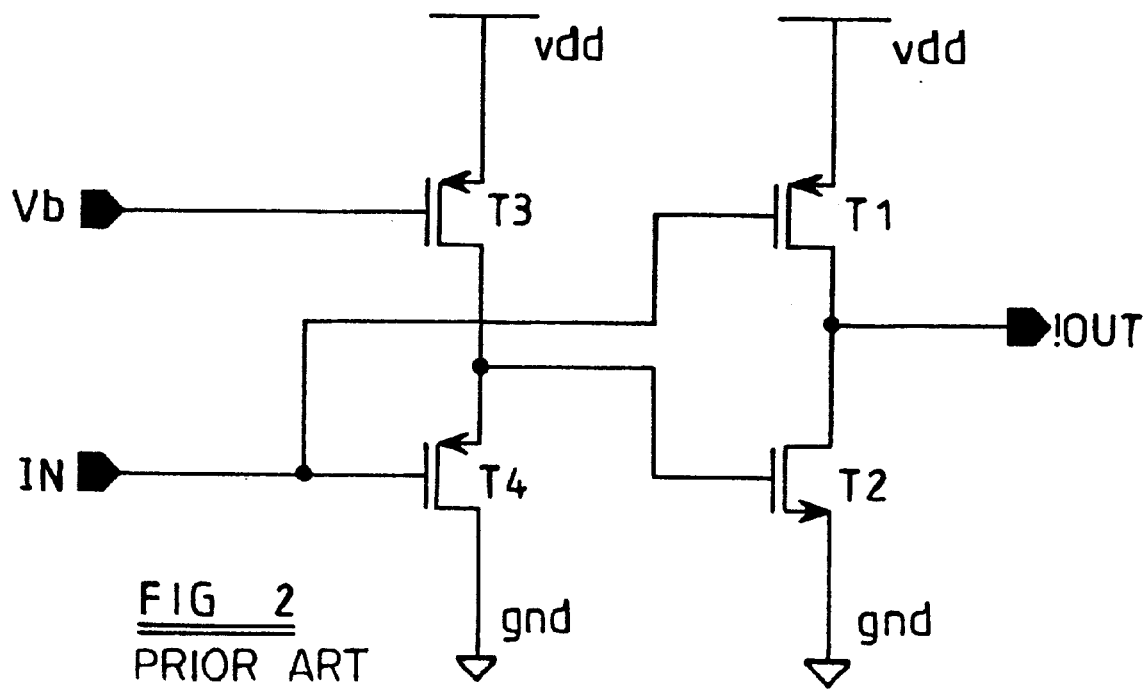
FIG. 2 is a circuit diagram of a known type of level shifter.
Figure 3:
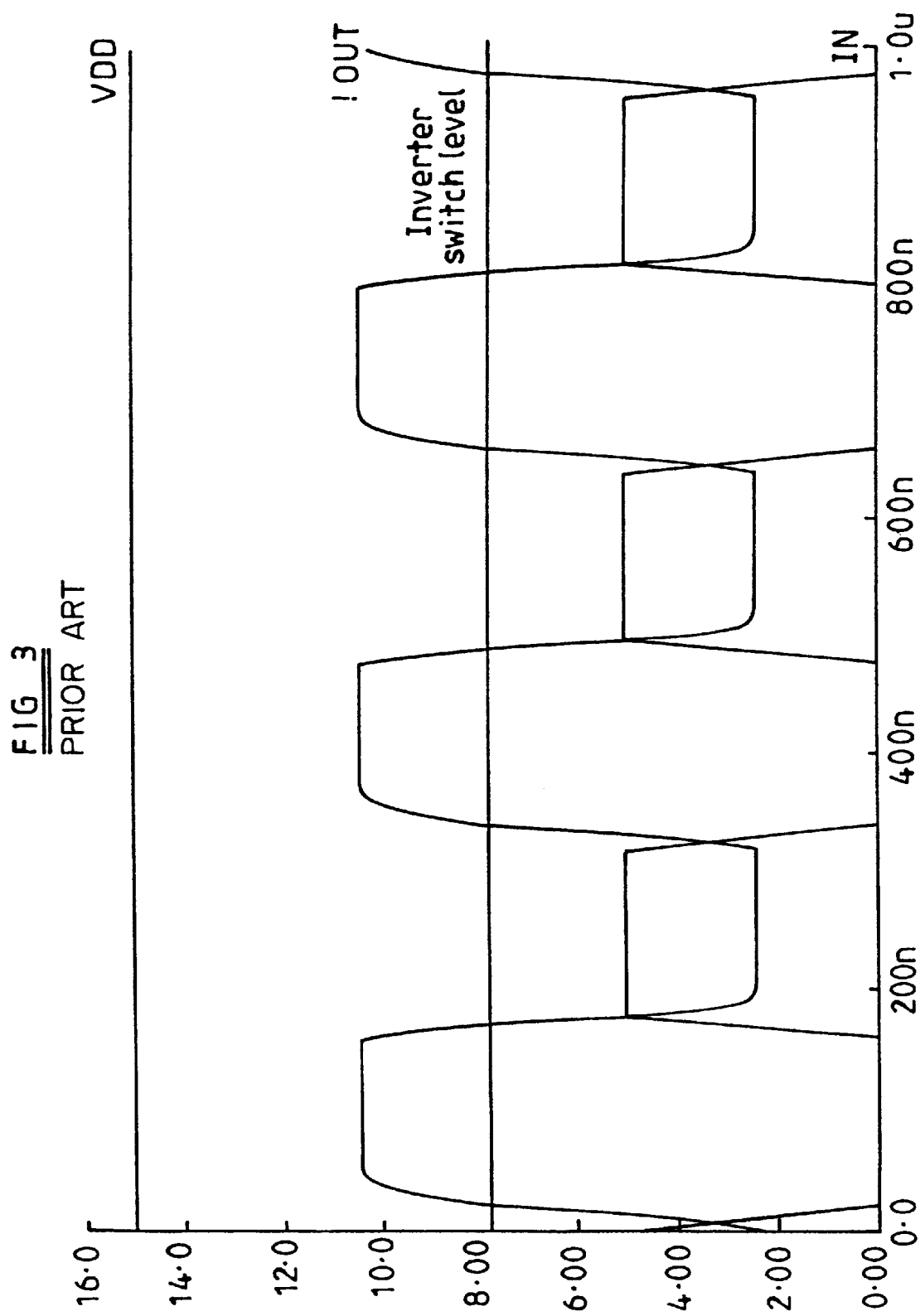
FIG. 3 is a waveform diagram illustrating the result of a simulation of the level shifter shown in FIG. 2.
Figure 4:
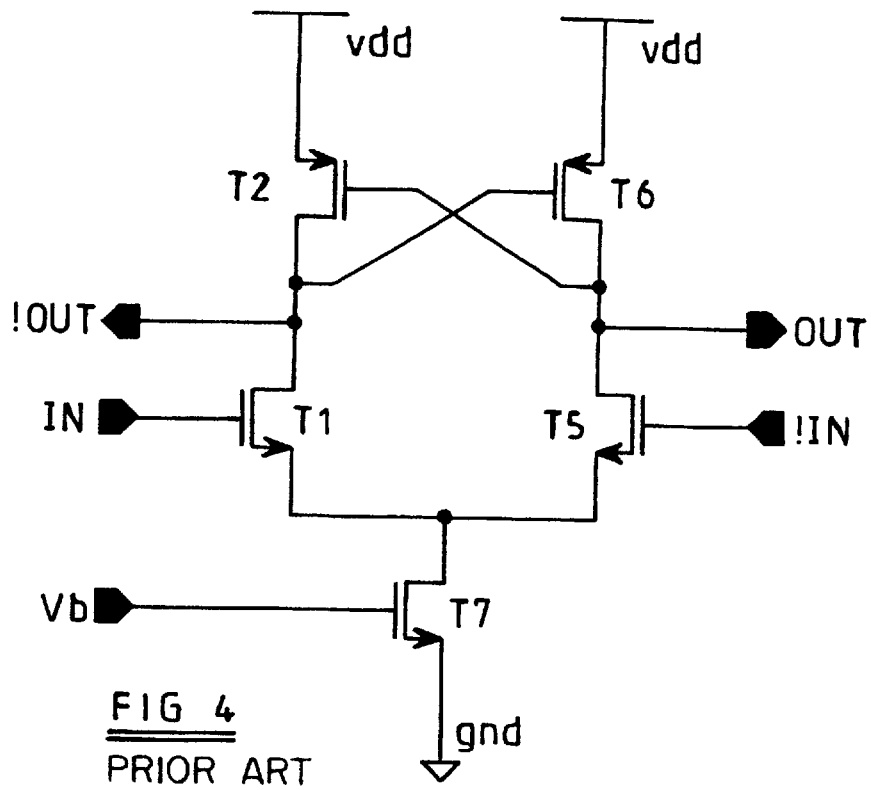
FIG. 4 is a circuit diagram of a known type of sense amplifier.
Figure 10:
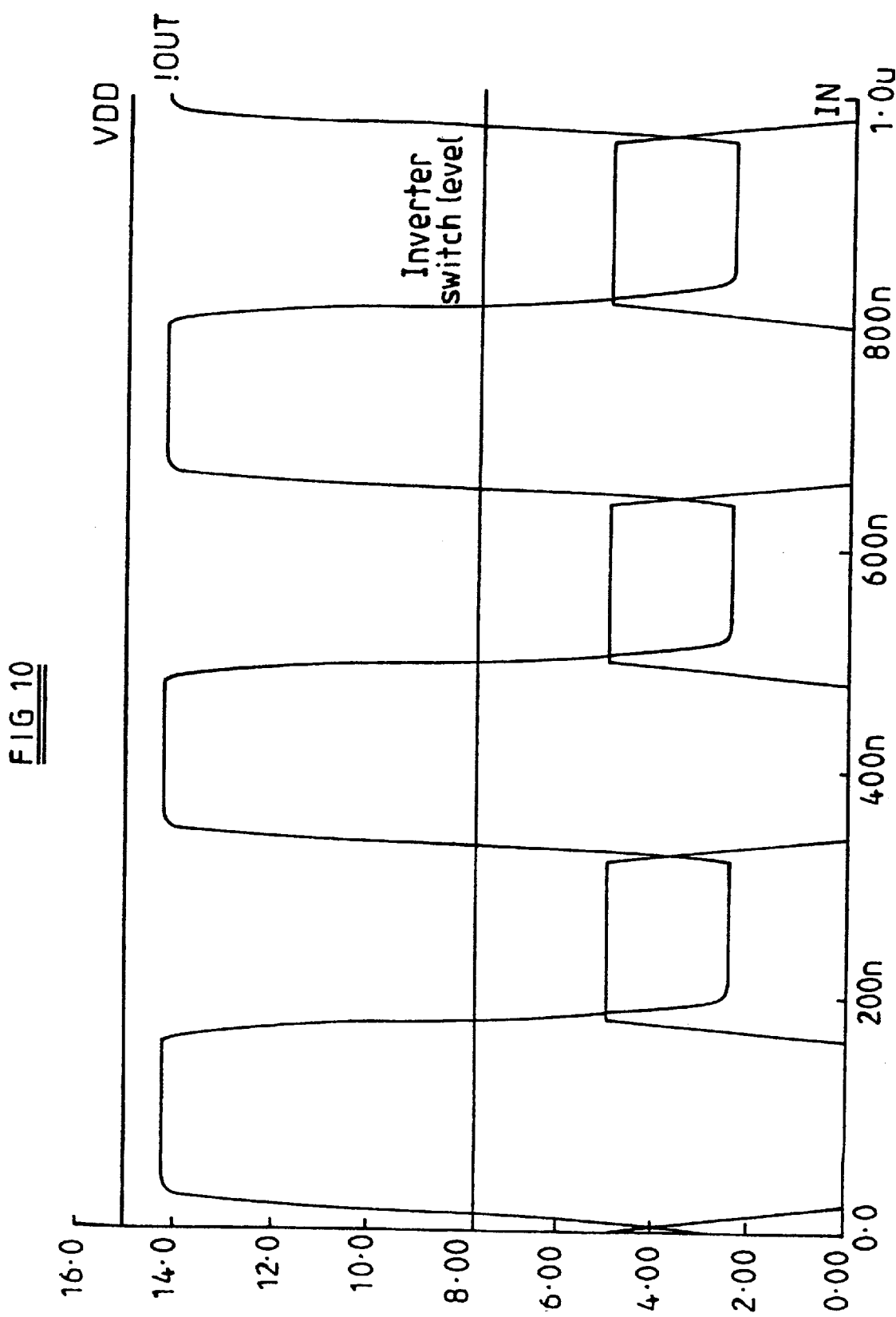
FIG. 10 is a waveform diagram illustrating a simulation of the level shifter shown in FIG. 9.

During operation of the level shifter of FIG. 9, when the input IN is high and the input !IN is low, the level shifter behaves as described hereinbefore for the level shifter of FIG. 2. The output !OUT is thus pulled down to 2.3 volts as illustrated in FIG. 10. When the input IN goes low and the input !IN goes high, the third transistor T3 is strongly turned on and tries to pull the output !OUT high. The source follower formed by the third and fourth transistors T3 and T4 drives the gate of the transistor T2 with a voltage which is lower than the supply voltage VDD (15 volts) but which is sufficient to turn the transistor T2 on. The 5 volt input signal at the input !IN is supplied to the source of the transistor T2 and thus reduces the gate-source voltage thereof so that the gate over-drive and pull-down capability at the output !OUT is restricted. Consequently, the output !OUT is pulled up to 14.4 volts by the action of the first transistor T1. This results in a larger output swing, as shown in FIG. 10, compared with that produced by the level shifter shown in FIG. 2, as illustrated in FIG. 3. A shown in FIG. 9, the output !OUT may be connected to the input of an inverter I, for example of the type shown in FIG. 1. The larger output voltage swing ensures that the inverter I is more fully switched and also allows the relative scaling of the transistors T1 and T2 to be less critical.

Figure 11:
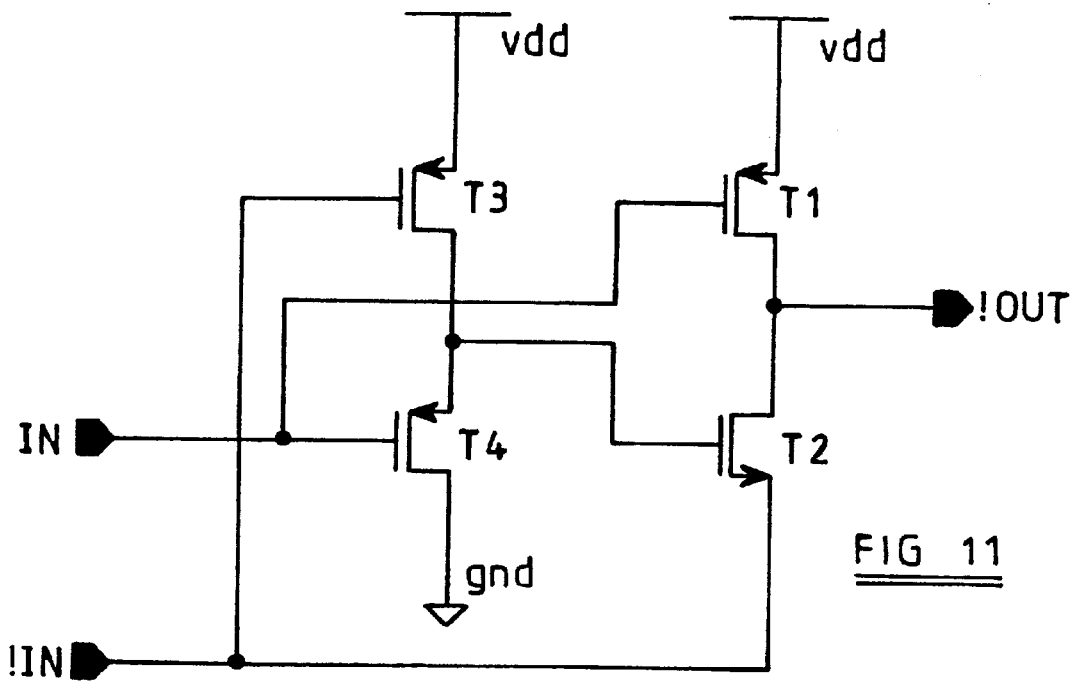
FIG. 11 is a circuit diagram of a modified type of level shifter of the type illustrated in FIG. 9 and constituting a second embodiment of the invention.

The level shifter shown in FIG. 11 differs from that shown in FIG. 9 in that the gate of the transistor T3 is connected to the inverting input !IN. The inverted input signal thus supplies the bias voltage for the source follower comprising the transistors T3 and T4 and increases the output voltage swing provided at the output !OUT.

When the input IN is high and the input !IN is low, the bias voltage supplied to the transistors T3 is 0 volts. The transfer characteristic of the source follower given by:

$$V_{OUT} V_{IN}+(VDD-Vb)$$

is such as to apply maximum boost to the output voltage and hence to the gate of the transistor T2. This helps to ensure that the output !OUT is pulled as low as possible. However, when the input IN is low and the input !IN is high, the bias voltage supplied to the transistor T3 is a small positive voltage. The source follower therefore operates with less voltage shift and ensures that the gate voltage of the transistor T2 is lower so that the output !OUT is pulled higher.

Figure 12:
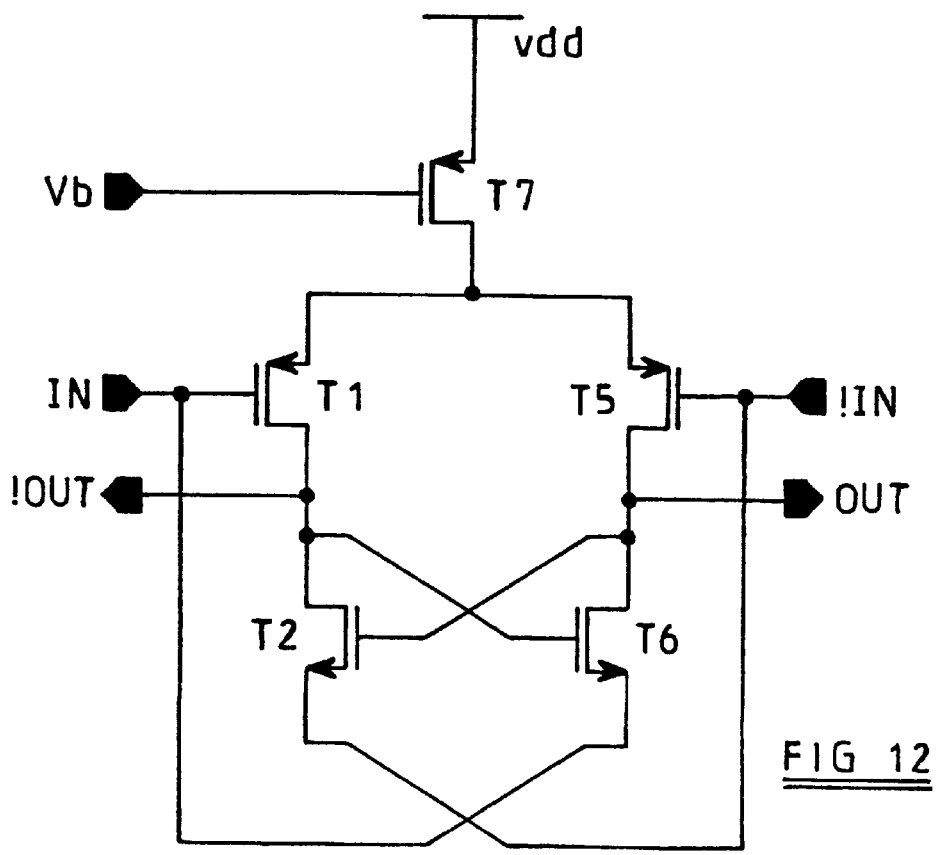
FIG. 12 is a circuit diagram of a level shifter constituting a third embodiment of the invention.

FIG. 12 shows a level shifter in the form of a cross-coupled N-typed CMOS sense amplifier. The level shifter of FIG. 12 is similar to that shown in FIG. 5 and will therefore be described in detail only in so far as it differs therefrom. In particular, the source of the second transistor T2 is connected to the input !IN whereas the source of the sixth transistor T6 is connected to the input IN. This results in faster switching of the level shifter by changing the gate-source voltages of the transistors T2 and T6.

Figure 5:
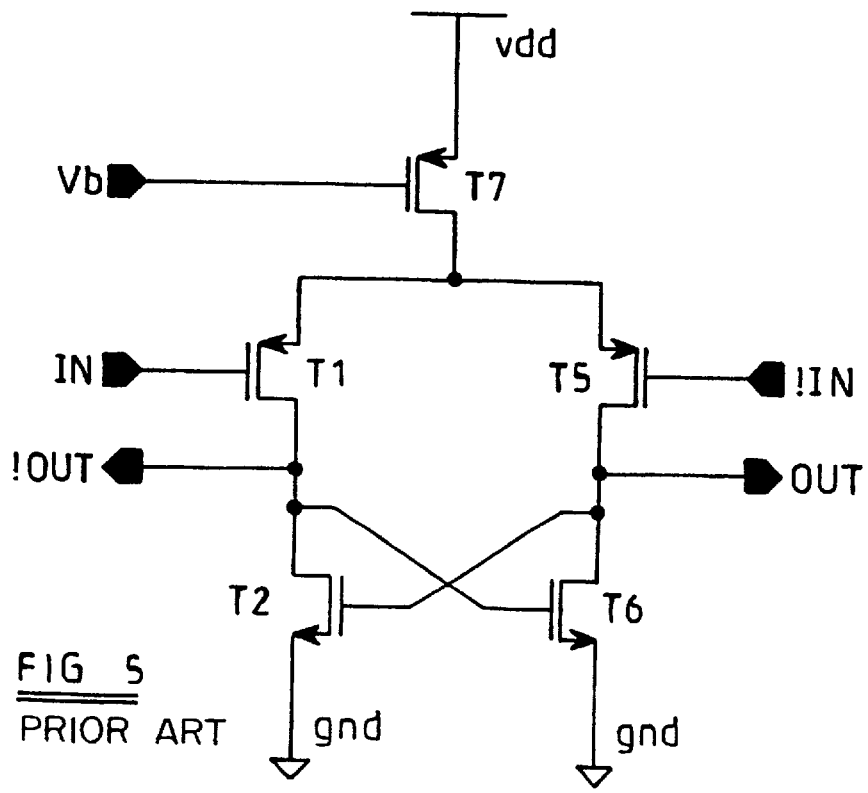
FIG. 5 is a circuit diagram of a sense amplifier of the type shown in FIG. 4 but for reversed polarity operation.
Figure 6:
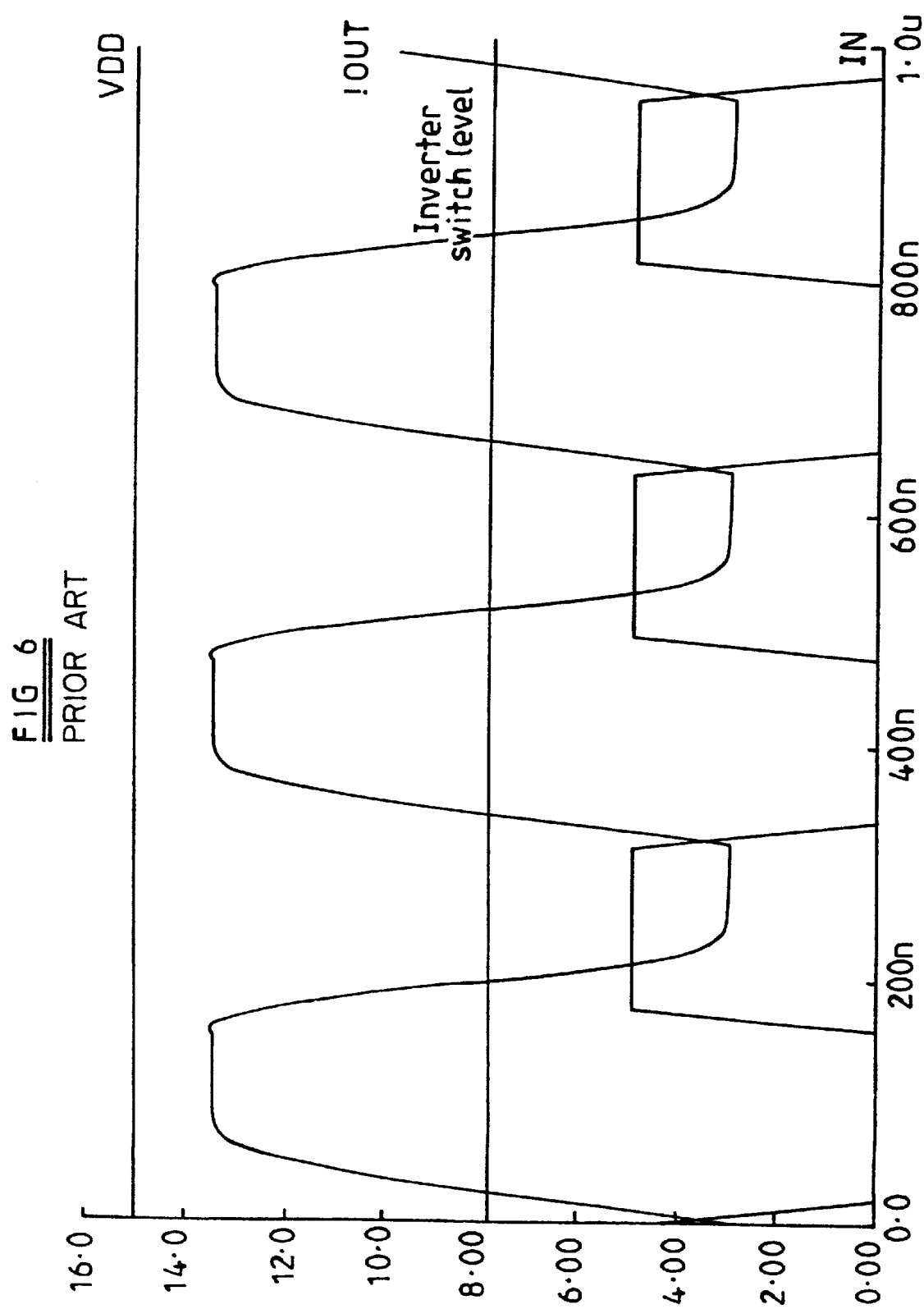
FIG. 6 is a waveform diagram illustrating a simulation of the amplifier illustrated in FIG. 5.
Figure 13:
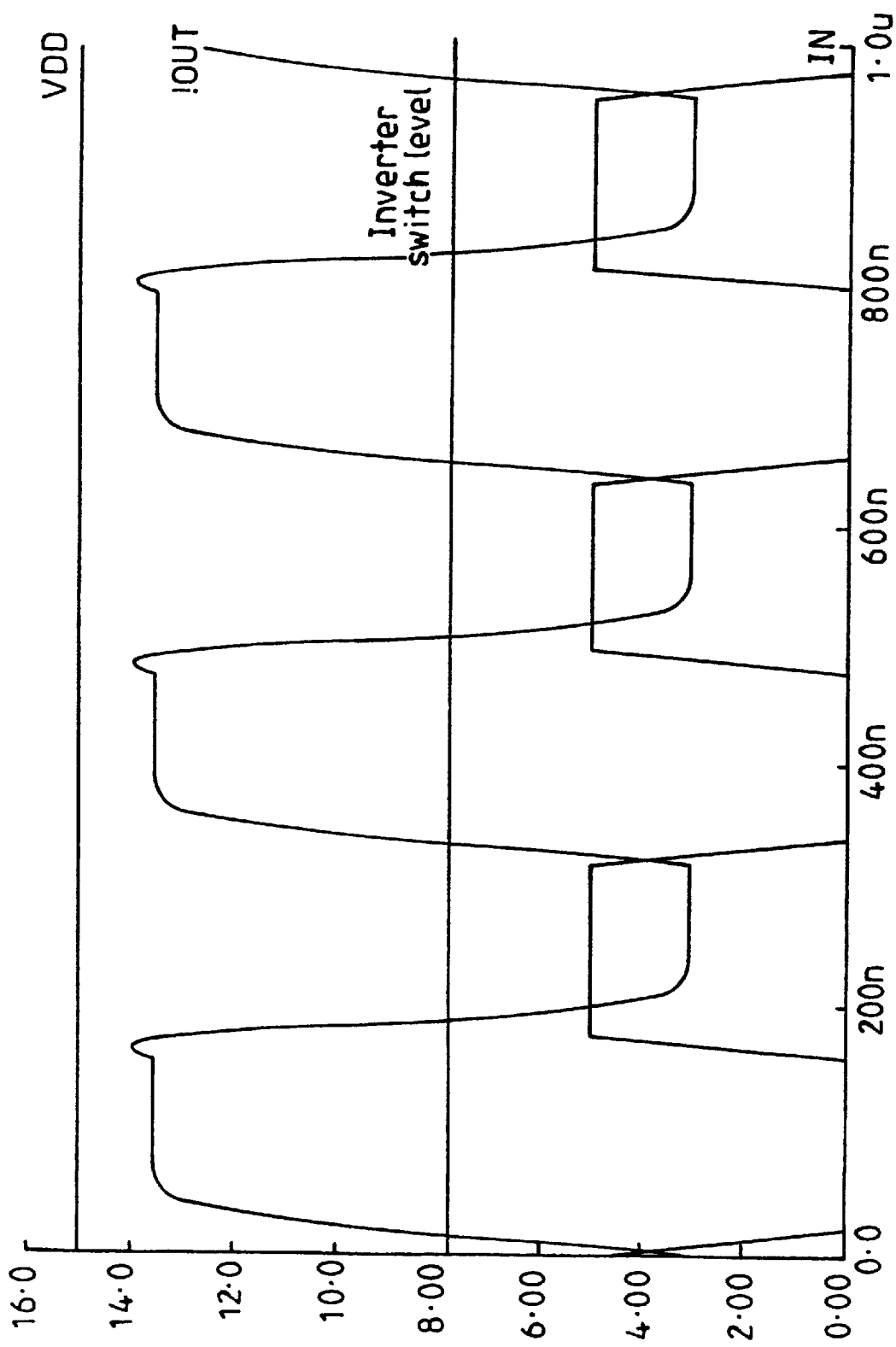
FIG. 13 is a waveform diagram illustrating a simulation of the level shifter shown in FIG. 12.

Operation of the level shifter of FIG. 12 is illustrated in FIG. 13, which is the result of a simulation with the same parameters as described hereinbefore. In this case, the output of the level shifter swings between the same voltage levels as that for the level shifter of FIG. 5 illustrated in FIG. 6. However, the response to a change in the input signals is much faster. For example, when the input IN goes high, the fifth transistor T5 becomes more turned on than the first transistor T1. The transistor T5 starts to pull the output OUT high but in conflict with the transistor T6. However, the source terminal voltage of the transistor T6 rises to 5 volts, which has the effect of reducing the gate over-drive of the transistor T6 sot hat the transistor T5 can charge the output OUT and the gate of the transistor T2 much more quickly.

The same operation occurs during the converse input transition. Thus, the response of the level shifter is more rapid.

Figure 7:
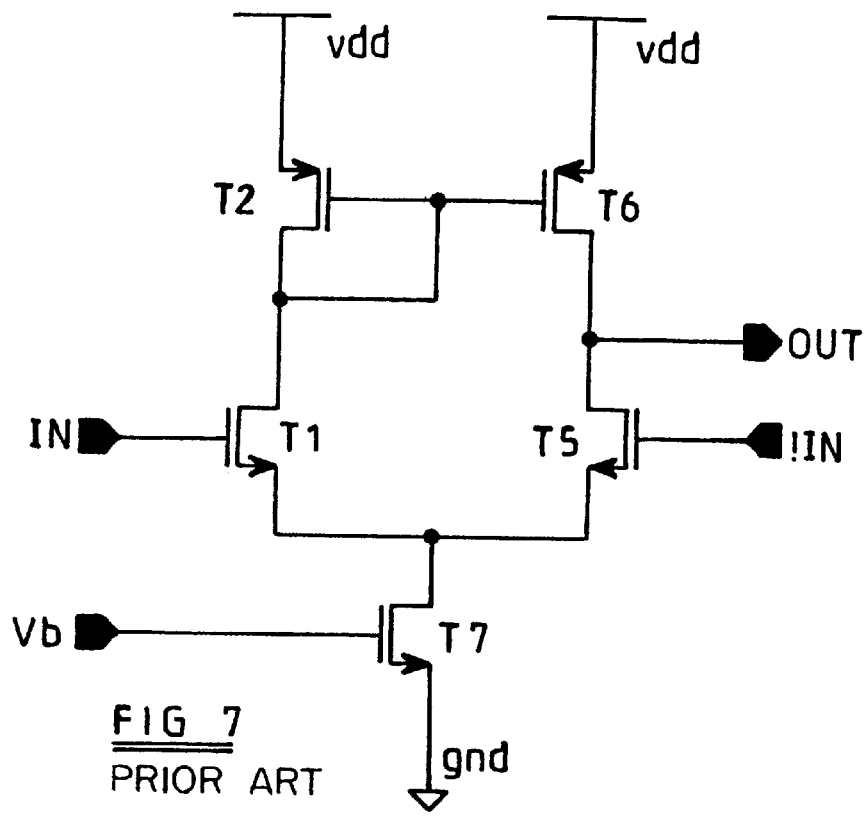
FIG. 7 is a circuit diagram of another known type of sense amplifier.
Figure 8:
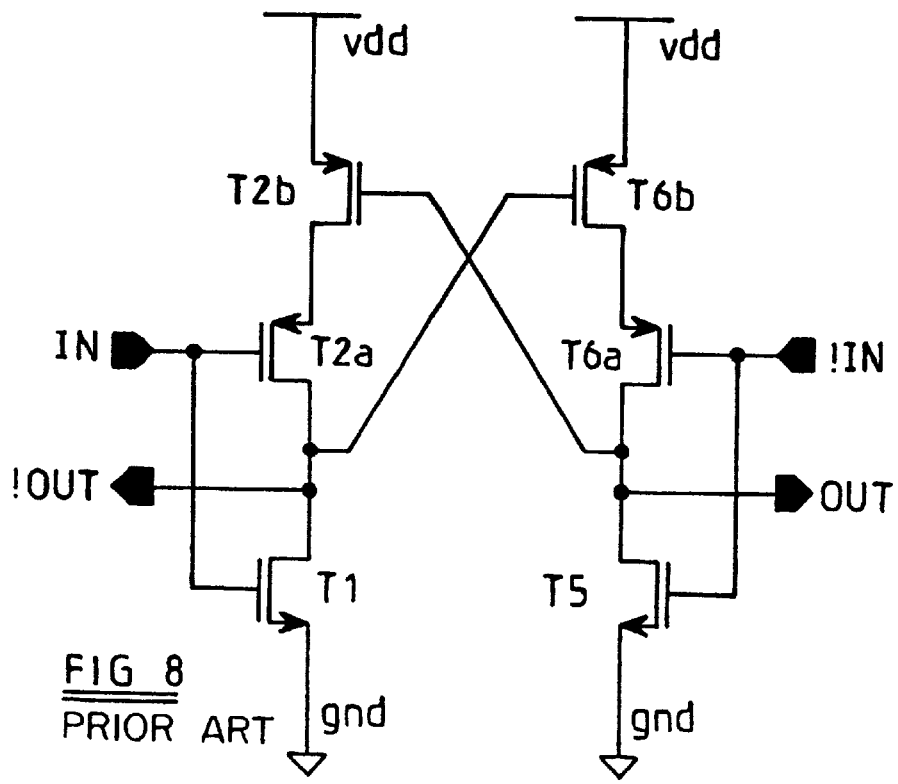
FIG. 8 is a circuit diagram of a known type of level shifter.
Figure 14:
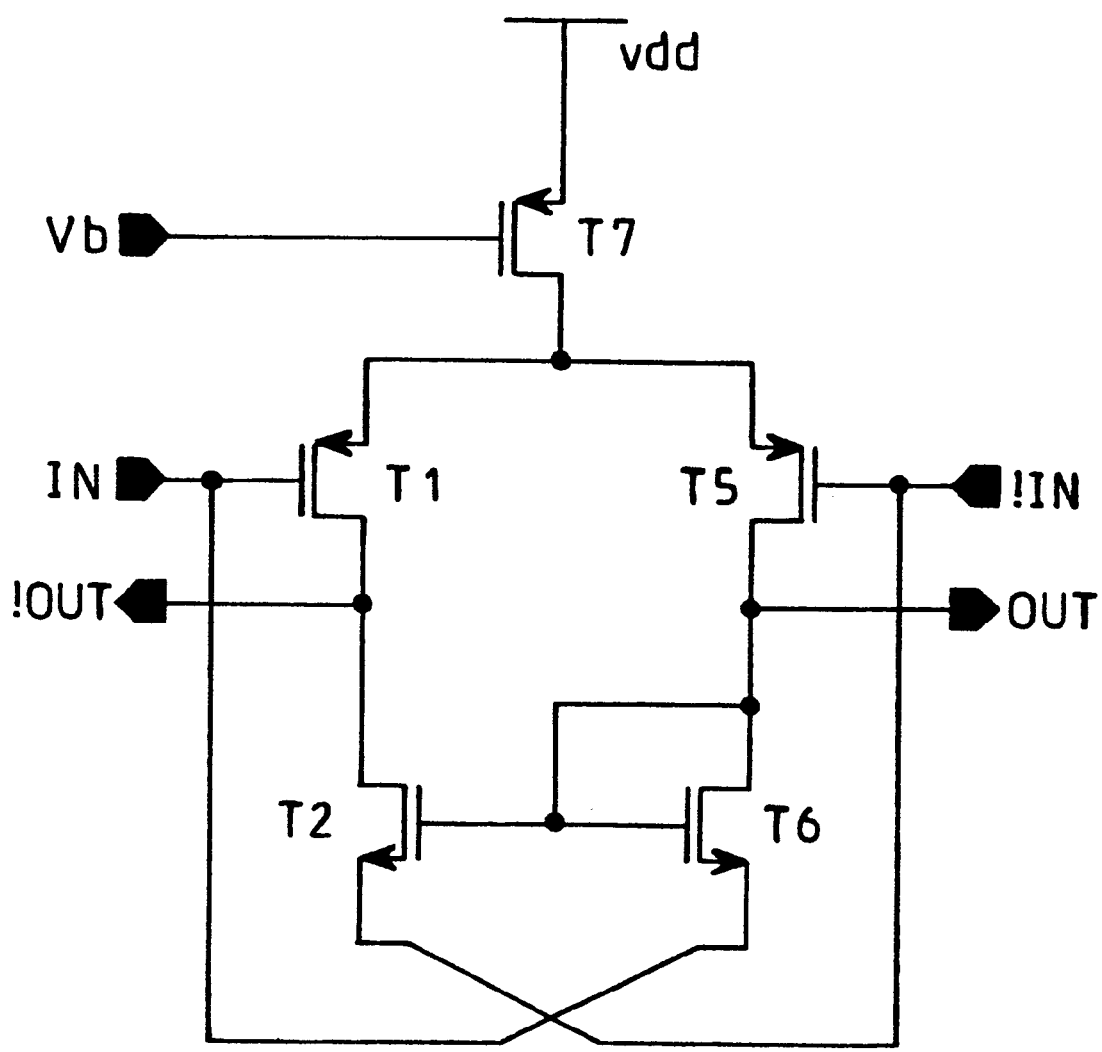
FIG 14 is a circuit diagram of a level shifter constituting a fourth embodiment of the invention.

FIG. 14 shows a source-coupled current mirror sense amplifier of the type shown in FIG. 7 but of opposite polarity and with the sources of the transistors T2 and T6 connected, as in the level shifter of FIG. 12, to the input !IN and IN, respectively. The basic operation and improvements for level shifting are thus similar to those described hereinbefore for the level shifter of FIG. 12.

Figure 15:
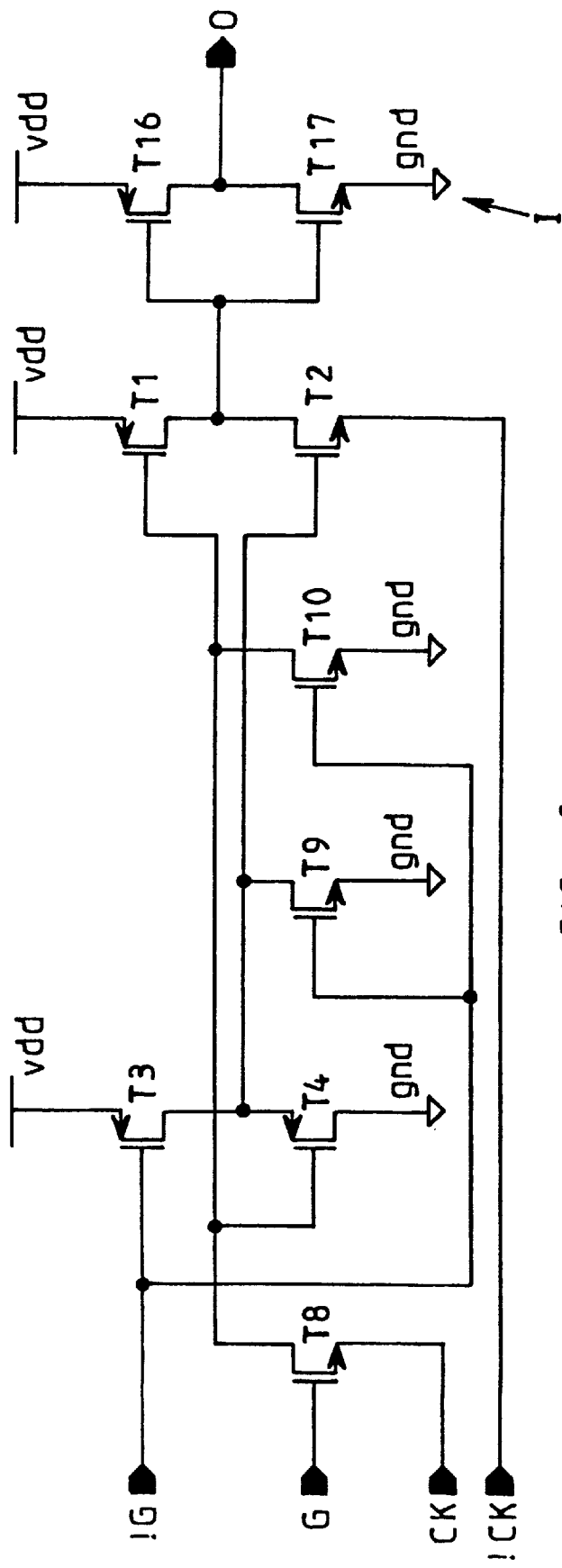
FIG. 15 is a circuit diagram of a gated level shifter constituting a fifth embodiment of the invention.

The level shifter shown in FIG. 15 comprises the level shifter shown in FIG. 9 with modifications to provide gating. Thus, the direct input illustrated for receiving clock signals CK is connected to the source of an eighth transistor T8 whose drain is connected to the gates of the transistors T1 and T4 and whose gate is connected to a gating input G for receiving direct gating signals. The gate of the transistor T3 is connected to a second gating input !G for receiving inverted gating signals. The gate of the transistor T2 is connected to ground via the source-drain path of a ninth transistor T9 whose gate is connected to the second gating input !G whereas the gate of the transistor T1 is connected via the source-drain path of a tenth T10 whose gate is connected to the second gating input !G. This arrangement allows the level shifter to draw almost no current when switched by gating signals at the inputs G and !G to the inactive state. When the inputs G and !G are high and low, respectively, so that the level shifter is enabled, the transistor T8 passes the direct input signal to the gates of the transistors T1 and T4. The source of the transistor T2 receives the inverted clock signals !CK at the second input of the level shifter. The gate of the transistor T3 is thus grounded so that the source follower operates with a maximum boost applied to the input signal. The transistor T9 and T10 are switched off so that the level shifter operates as described hereinbefore with reference to the level shifter of FIG. 9.

When the gating inputs G and !G are low and high, respectively, the transistors T9 and T10 are turned on so as to ensure that the transistor T2 is turned off, the transistor T1 is turned on and the output at the drains of the transistors T1 and T2 is high. Because the transistor T3 is off and the transistors T1 and T4 are isolated from clock signal CK by the transistor T8, which is turned off, the output of the inverted I formed by the transistors T16 and T17 is held low.

In both the enabled and disabled modes of operation, the complementary clock signals CK and !CK do not drive the gates of any transistors directly. Instead, the clock signals are gated by the transistors T2 and T8. Capacitive loading is thus reduced on the lines supplying the clock signals.

Figure 16:
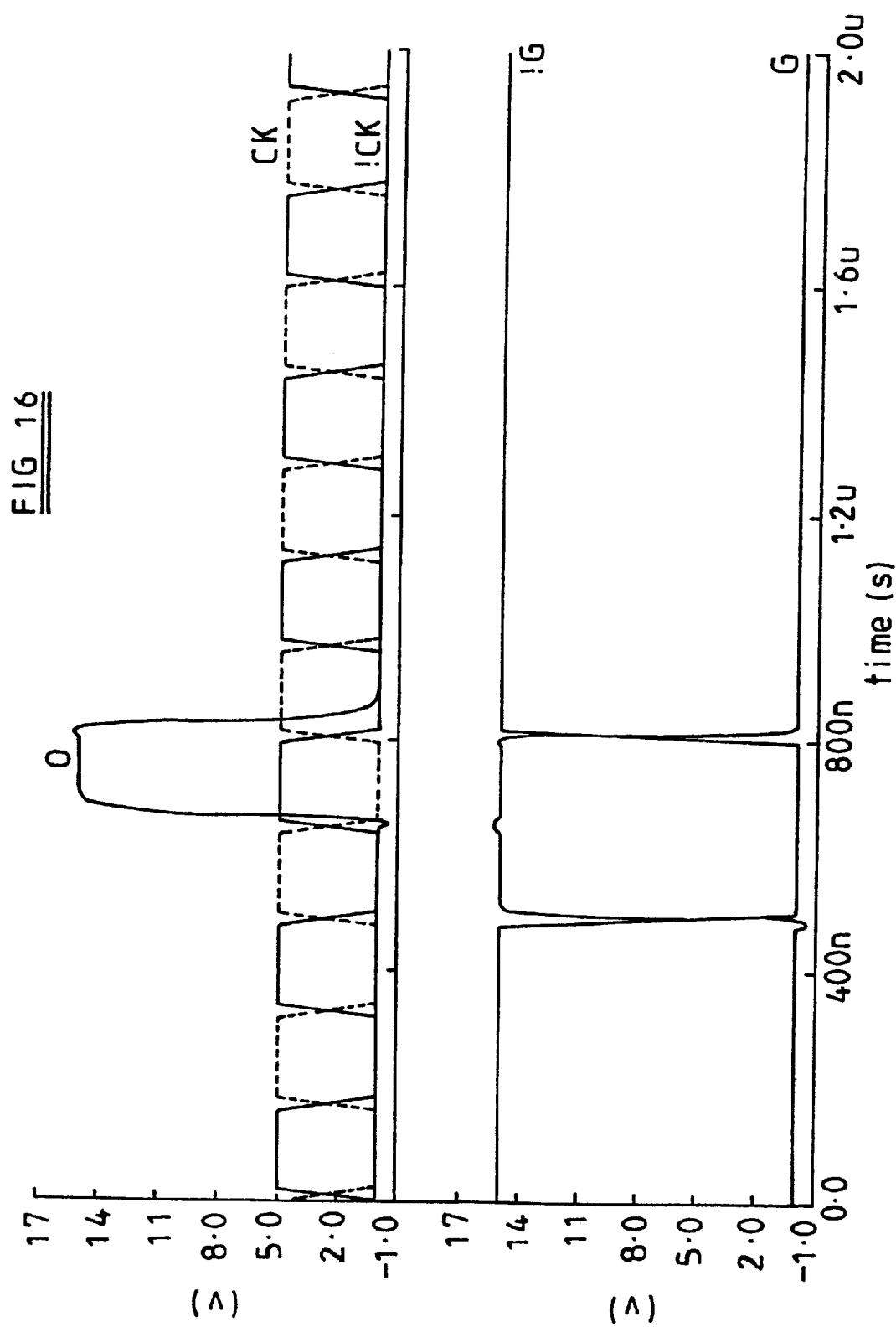
FIG. 16 is a waveform diagram illustrating a simulation of the level shifter shown in FIG. 15.

FIG. 16 illustrates the result of a simulation of the level shifter of FIG. 15 with the same parameters as described hereinbefore. The lower waveform diagram illustrates the complementary gating signals whereas the upper waveform diagram illustrates the complementary clock signals and the output O of the inverter I. The level shifter thus provides a level shifter version of the clock signals only when enabled by the gating signals. Otherwise, the output O is held at logic low.

Figure 17:
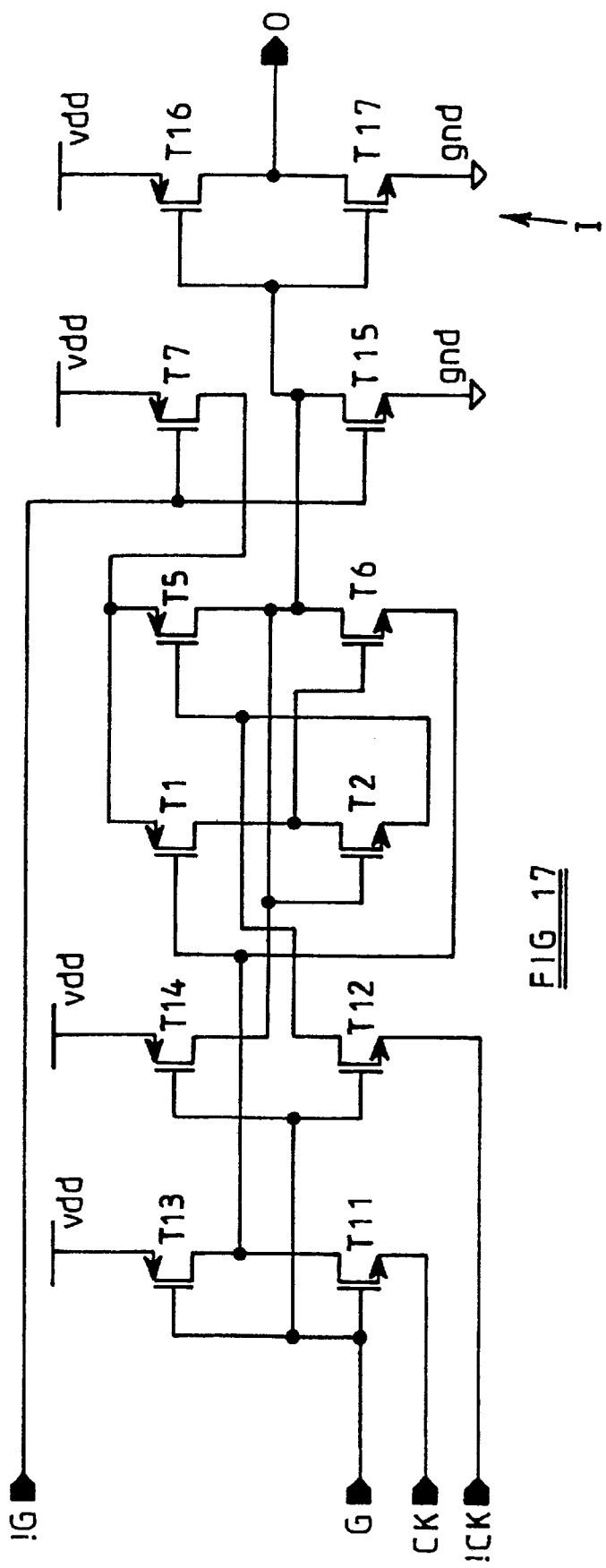
FIG. 17 is a circuit diagram of a gated level shifter constituting a sixth embodiment of the invention.

FIG. 17 shows a gated level shifter based on the level shifter shown in FIG. 12 and incorporating an inverted I of the type shown in FIG. 15. The level shifter of FIG. 17 illustrated for use with complementary clock input signals CK and !CK and with first and second gating inputs G and !G for receiving complementary gating or enable signals. The inputs are connected via the source-drain paths of eleventh and twelfth transistors T11 and T12 to the gates of the transistors T1 and T5 and to the sources of the transistors T6 and T2, respectively. The gates of the transistors T11 and T12 are connected to the first gating input G. The gates of the transistors T1 and T2 are connected via pull-up transistors T13 and T14 to the supply line vdd. The gates of the transistors T13 and T14 are connected to the gating input G.

The gate of the current source transistor T7 is connected to the second gating input !G. The input of the inverted I is connected via a pull-down transistor T15 to ground gnd. The gate of the transistor T15 is connected to the second gating input !G.

Figure 18:
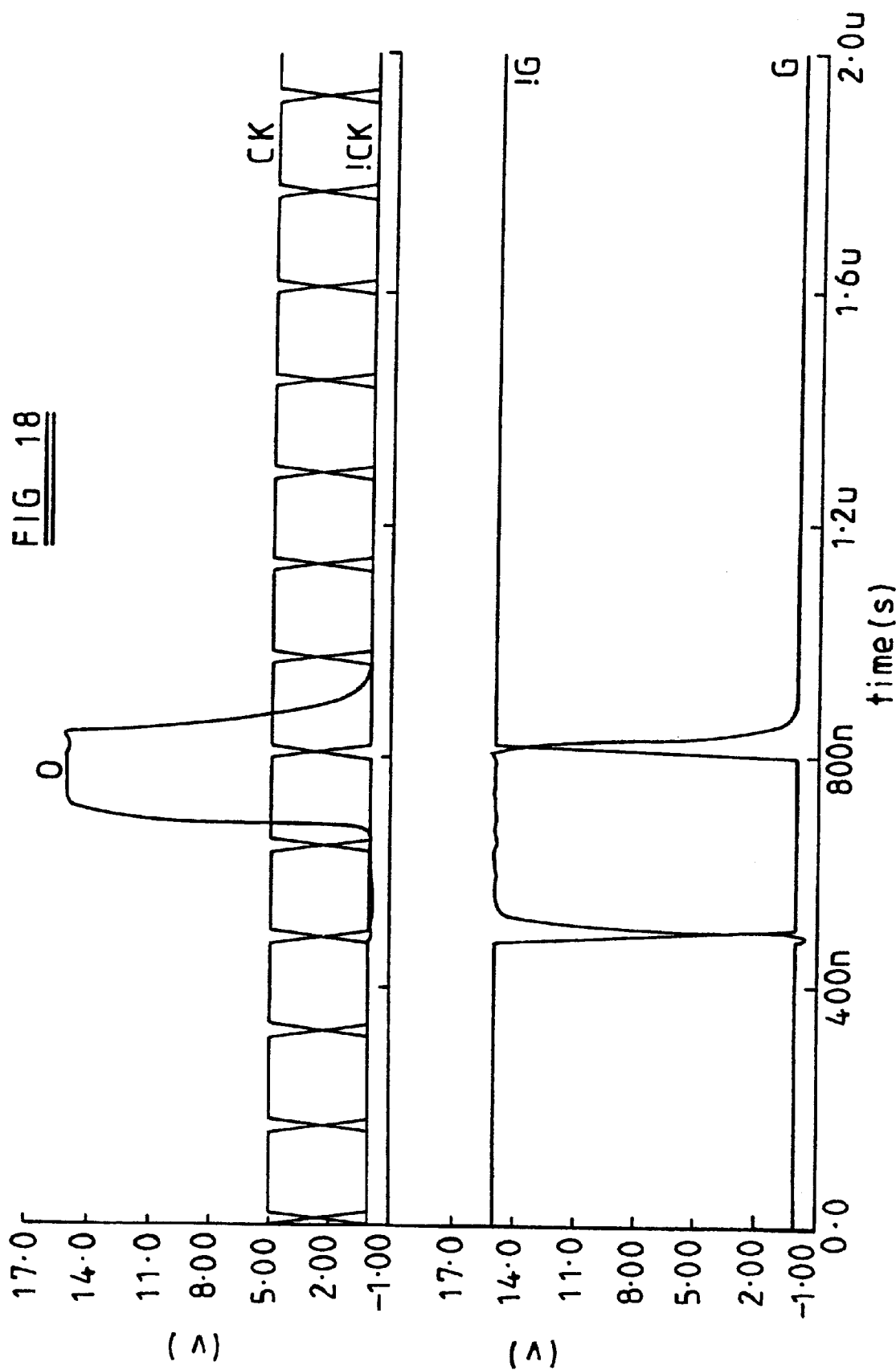
FIG. 18 is a waveform diagram illustrating a simulation of the level shifter shown in FIG. 17.

When the gating inputs G and !G are high and low, respectively, the level shifter is enabled and the transistors T11 and T12 pass the complementary clock signals CK and !CK to the gates of the transistors T1 and T5 and to the sources of the transistors T6 and T2, respectively. The gate of the transistor T7 is grounded so that the sense amplifier operates with a high tail current. The output O follows the logic state of the inverted clock signals !CK with the appropriate level shift as illustrated in FIG. 18. When the gating inputs G and !G are low and high, respectively, the transistors T11 and T12 isolate the inputs from the sense amplifier. The transistor T7 is turned off so that substantially no current flows through the sense amplifier. The pull-up transistors T13 and T14 and the pull-down transistor T15 are turned on so as to ensure that the output O is held at its default logic low state as shown in FIG. 18. Thus, no currents other than leakage currents flow through the level shifter.

What is claimed is:

1. A voltage level shifter comprising:
    a first circuit branch,
    a first input for receiving a direct input signal,
    a second input for receiving an inverted input signal, and
    an output for producing an inverted output signal which is inverted and level-shifted relative to the direct input signal,
    the first circuit branch comprising:
        a first transistor, of a first conduction type, whose output electrode is connected to the output and whose control electrode is connected to the first input, and
        a second transistor, of a second conduction type opposite the first conduction type, whose output electrode is connected to the output, whose control electrode is arranged to receive a signal corresponding to the direct input signal, and whose common electrode is connected to the second input,
    wherein the control electrode of the second transistor is connected to a second circuit branch, and
    the second circuit branch comprises third and fourth transistors, of the first conducting type, whose main conduction paths are connected in series between first and second power supply inputs, the control electrode of the fourth transistor being connected to the first input and the control electrode of the second transistor being connected to the output electrode of the third transistor and to a common electrode of the fourth transistor.

2. A voltage level shifter as claimed in claim 1, in which a common electrode of the first transistor is connected to the first power supply input.

3. A voltage level shifter as claimed in claim 1, in which a control electrode of the third transistor is connected to a first bias voltage input.

4. A voltage level shifter as claimed in claim 1, in which a control electrode of the third transistor is connected to the second input.

5. A voltage level shifter as claimed in claim 1, in which the first input is connected to the control electrodes of the first and fourth transistors via a main conduction path of an eighth transistor whose control electrode is connected to a first gating input for receiving a direct gating signal.

6. A voltage level shifter as claimed in claim 5, in which the control electrode of the third transistor is connected to a second gating input for receiving an inverted gating signal.

7. A voltage level shifter as claimed in claim 6, in which the control electrode of the second transistor is connected to the second power supply input via a main conduction path of a ninth transistor whose control electrode is connected to the second gating input.

8. A voltage level shifter as claimed in claim 6, in which the control electrode of the first transistor is connected to the second power supply input via a main conduction path of a tenth transistor whose control electrode is connected to the second gating input.

9. A voltage level shifter as claimed in claim 1, in which the output is connected to the input of an inverter.

10. A voltage level shifter as claimed in claim 1, in which each of the transistors comprises a field effect transistor and the output, control and common electrodes comprise drain, gate and source electrodes, respectively.

11. A voltage level shifter as claimed in claim 10, in which each of the transistors comprises an amorphous silicon thin film transistor.

12. A voltage level shifter as claimed in claim 10, in which each of the transistors comprises a poly-silicon thin film transistor.

13. A voltage level shifter as claimed in any one of claims 10, comprising at least part of a CMOS integrated circuit.

* * * * *